US012804833B2

(12) United States Patent
Wu et al.

(10) Patent No.: US 12,804,833 B2
(45) Date of Patent: Nov. 17, 2026

(54) ELECTRONIC DEVICE AND POWER CABLE THEREOF

(71) Applicant: Wistron NeWeb Corp., Hsinchu (TW)

(72) Inventors: Che-Cheng Wu, Hsinchu (TW); Chen-Wei Huang, Hsinchu (TW); Yu-Hsiang Lin, Hsinchu (TW); Ya-Hui Lo, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 217 days.

(21) Appl. No.: 18/776,672

(22) Filed: Jul. 18, 2024

(65) Prior Publication Data

US 2025/0056746 A1 Feb. 13, 2025

(30) Foreign Application Priority Data

Aug. 10, 2023 (TW) ................................ 112130093

(51) Int. Cl.
*H05K 5/02* (2006.01)
*H01R 13/58* (2006.01)
(Continued)

(52) U.S. Cl.
CPC ....... *H05K 5/0247* (2013.01); *H01R 13/5825* (2013.01); *H01R 13/625* (2013.01); *H01R 13/74* (2013.01)

(58) Field of Classification Search
None
See application file for complete search history.

(56) References Cited

U.S. PATENT DOCUMENTS 3,638,169 A * 1/1972 Caveney ............ H01R 13/5804 439/471
4,169,572 A * 10/1979 Simon .................. H02G 3/0658 16/2.5

(Continued)

FOREIGN PATENT DOCUMENTS

CN 201438568 U * 4/2010
CN 102025078 A * 4/2011

(Continued)

OTHER PUBLICATIONS

Guo (CN_102025078_A_H) (Year: 2011).*

(Continued)

*Primary Examiner* — Allen L Parker
*Assistant Examiner* — Elisa Sasserath
(74) *Attorney, Agent, or Firm* — McClure, Qualey & Rodack, LLP

(57) ABSTRACT

An electronic device including a device housing, a cable, a cable positioning structure, and a housing restriction structure is provided. The device housing includes a through hole. The through hole includes a central region, a first channel region, and a second channel region. The cable passes through the device housing. The cable positioning structure is disposed on the cable. The cable positioning structure includes a first protrusion and a second protrusion. The cable positioning structure is adapted to be rotated between a first orientation and a second orientation relative to the device housing. The housing restriction structure is disposed on the device housing. The housing restriction structure includes a first restrain member and a first stopper. In a positioned state, the cable positioning structure is in the second orientation. The first restrain member and the first stopper restrict the cable positioning structure.

9 Claims, 6 Drawing Sheets

(51) Int. Cl.
*H01R 13/625* (2006.01)
*H01R 13/74* (2006.01)

(56) References Cited

U.S. PATENT DOCUMENTS

| | | | | |
|---|---|---|---|---|
| 7,479,027 | B1 * | 1/2009 | Miller | H01R 13/59 439/461 |
| 9,929,552 | B2 * | 3/2018 | Chen | H01R 13/58 |
| 2006/0027387 | A1 * | 2/2006 | Goto | H02G 15/04 174/651 |
| 2015/0070857 | A1 * | 3/2015 | Lin | H01R 24/58 361/752 |

FOREIGN PATENT DOCUMENTS

| | | | | | |
|---|---|---|---|---|---|
| CN | 109982531 | B | | 6/2021 | |
| TW | I475775 | B | * | 3/2015 | H01R 13/58 |

OTHER PUBLICATIONS

Huang (CN_201438568_U) (Year: 2010).*
Guo et. al (CN 102025078 A) (Year: 2011).*
Huang et. al (CN 201438568 U) (Year: 2010).*
Chen et. al (TW I475775 B) (Year: 2015).*
Google patents search results (Year: 2026).*

* cited by examiner

ELECTRONIC DEVICE AND POWER CABLE THEREOF

CROSS REFERENCE TO RELATED APPLICATIONS

This application claims the benefit of priority to Taiwan Patent Application No. 112130093, filed on Aug. 10, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

BACKGROUND OF THE INVENTION

Field of the Invention

The present disclosure relates to an electronic device, in particular to an electronic device that restrict the position of a cable.

Description of the Related Art

In the current technology, an electronic device has a device housing and a power cord, with a cable positioning structure disposed on the power cord. The cable positioning structure is engaged with the device housing to secure the power cord. The design of the conventional cable positioning structure is relatively complex and is often manufactured using two shot injection moldings, resulting in higher production costs and a lack of pre-positioning functionality.

BRIEF SUMMARY OF THE INVENTION

Embodiments of the present disclosure are configured to address the issues in the conventional art, which provide an electronic device including a device housing, a cable, a cable positioning structure, and a housing restriction structure. The device housing includes a through hole. The through hole includes a central region, a first channel region, and a second channel region. The first channel region is communicated with the central region. The second channel region is communicated with the central region. The cable passes through the device housing. The cable positioning structure is disposed on the cable. The cable positioning structure includes a first protrusion and a second protrusion. The cable positioning structure is adapted to be rotated relative to the device housing between a first orientation and a second orientation. The housing restriction structure is disposed on the device housing. The housing restriction structure includes a first restrain member and a first stopper. In an installed state, the cable positioning structure is in the first orientation. The first protrusion is adapted to pass through the first channel region. The second protrusion is adapted to pass through the second channel region. In a positioned state, the cable positioning structure is in the second orientation. The first restrain member and the first stopper restrict the cable positioning structure.

In one embodiment, the first restrain member is adjacent to the first channel region. When the cable positioning structure is rotated relative to the device housing from the first orientation to the second orientation along a first direction, the first protrusion crosses the first restrain member.

In one embodiment, the first restrain member includes a first inclined surface. When the cable positioning structure is rotated relative to the device housing from the first orientation to the second orientation, the first protrusion is guided by the first inclined surface and crosses the first restrain member.

In one embodiment, the first restrain member includes a first restrain surface. When the cable positioning structure is in the second orientation, the first restrain surface is adapted to restrict the first protrusion to prevent the cable positioning structure from rotating from the second orientation to the first orientation along a second direction relative to the device housing. The first direction is opposite to the second direction.

In one embodiment, when the cable positioning structure is in the second orientation, the first stopper is adapted to restrict the first protrusion to prevent the cable positioning structure from rotating along the first direction.

In one embodiment, when the cable positioning structure is in the second orientation, the first stopper is adapted to restrict the second protrusion to prevent the cable positioning structure from rotating along the first direction.

In one embodiment, the through hole further includes a third channel region. The third channel region is communicated with the central region. The cable positioning structure further includes a third protrusion. When the cable positioning structure is in the first orientation, the third protrusion is adapted to pass through the third channel region.

In one embodiment, the housing restriction structure includes a second restrain member. When the cable positioning structure is in the second orientation, the second stopper is adapted to restrict the second protrusion to prevent the cable positioning structure from rotating along the first direction.

In one embodiment, the housing restriction structure includes a second restrain member. The second restrain member is adjacent to the third channel region. When the cable positioning structure is rotated from the first orientation to the second orientation along the first direction relative to the device housing, the third protrusion crosses the second restrain member.

In one embodiment, the first restrain member and the second stopper are located at two sides of the first channel region. The first stopper and the second restrain member are located at two sides of the third channel region.

In one embodiment, the first protrusion, the second protrusion, and the third protrusion are extended along the radius direction of the cable.

In one embodiment, the size of the first protrusion is different from the size of the second protrusion. The size of the first channel region matches the size of the first protrusion. The size of the second channel region matches the size of the second protrusion.

In one embodiment, the cable positioning structure further includes an abutting member. in the positioned state, part of the device housing is clamped between the abutting member and the first protrusion. Part of the device housing is clamped between the abutting member and the second protrusion.

In another embodiment, the present disclosure provides an electronic device including a device housing and a housing restriction structure. The device housing includes a through hole. The through hole includes a central region, a first channel region, a second channel region, and a third channel region. The first channel region is communicated with the central region. The second channel region is communicated with the central region. The third channel region is communicated with the central region. The housing restriction structure is disposed on the device housing. The housing restriction structure includes a first restrain member and a first stopper. The first restrain member includes a first inclined surface. The first inclined surface is adjacent to the first channel region.

In one embodiment, the size of the first channel region is different from the size of the second channel region.

In one embodiment, the first restrain member and the first stopper are located between the first channel region and the third channel region.

In one embodiment, the first channel region is located between the first restrain member and the first stopper.

In another embodiment, the present disclosure provides a power cord including a cable and a cable positioning structure. The cable positioning structure is disposed on the cable. The cable positioning structure includes a first protrusion, a second protrusion, and a third protrusion. The first protrusion, the second protrusion, and the third protrusion are extended along the radius direction of the cable. The size of the first protrusion is different from the size of the second protrusion.

The electronic device according to the embodiments of the present disclosure incorporates a design that combines a cable positioning structure with a housing restriction structure. The design of the cable positioning structure is relatively simple and can be manufactured in a one-shot injection molding process, resulting in lower production costs. Furthermore, in the positioned state, the first restrain member and the first stopper of the housing restriction structure restrict the cable positioning structure, thereby providing a pre-positioning function to prevent the cable from detaching during the assembly process on the production line.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
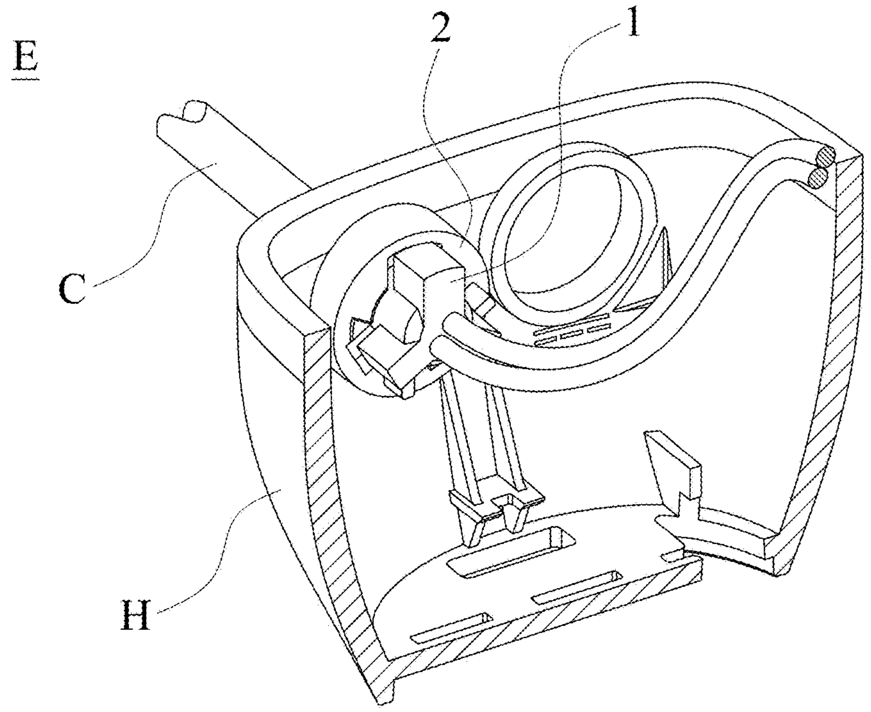
FIG. 1 is an assembly view of an electronic device according to first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 2:
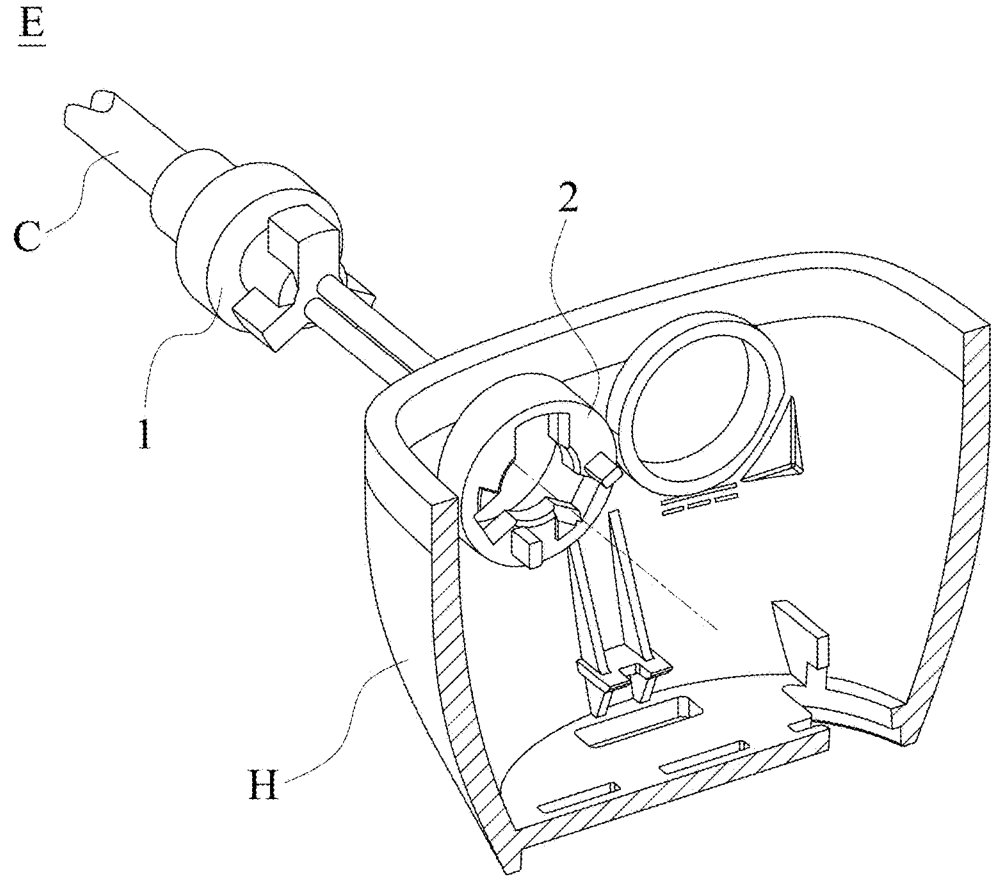
FIG. 2 is an exploded view of the electronic device according to the first embodiment of the present disclosure.
Figure 3:
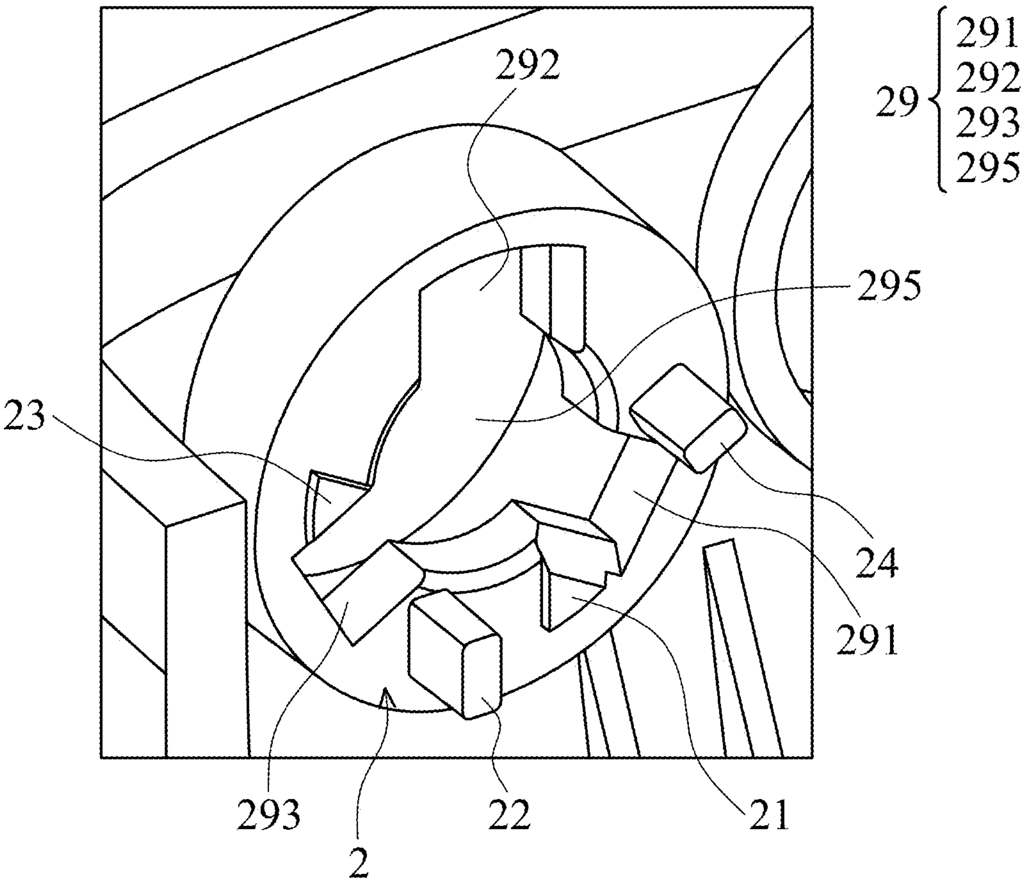
FIG. 3 shows a detailed configuration of a housing restriction structure according to the first embodiment of the present disclosure.
Figure 4:
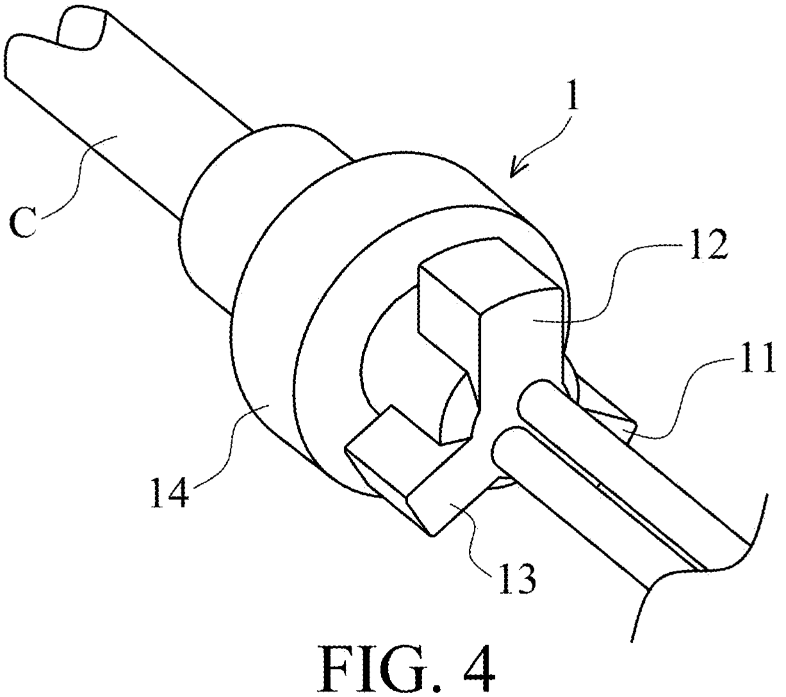
FIG. 4 shows a detailed configuration of a cable positioning structure according to the first embodiment of the present disclosure.

FIG. 1 is an assembly view of an electronic device according to first embodiment of the present disclosure. FIG. 2 is an exploded view of the electronic device according to the first embodiment of the present disclosure. FIG. 3 shows a detailed configuration of a housing restriction structure according to the first embodiment of the present disclosure. FIG. 4 shows a detailed configuration of a cable positioning structure according to the first embodiment of the present disclosure. Refers to FIGS. 1, 2, 3, and 4 together. An electronic device in the embodiments of the present disclosure includes a device housing H, a cable C, a cable positioning structure 1, and a housing restriction structure 2. The device housing H includes a through hole 29. The through hole 29 includes a central region 295, a first channel region 291, and a second channel region 292. The first channel region 291 is communicated with the central region 295. The second channel region 292 is communicated with the central region 295. The cable C passes through the device housing H. The cable positioning structure 1 is disposed on the cable C. The cable positioning structure 1 includes a first protrusion 11 and a second protrusion 12. The housing restriction structure 2 is disposed on the device housing H.

In one embodiment, the electronic device can be a wireless router or an electronic device with other functions. The above content does not limit the present disclosure.

Figure 5A:
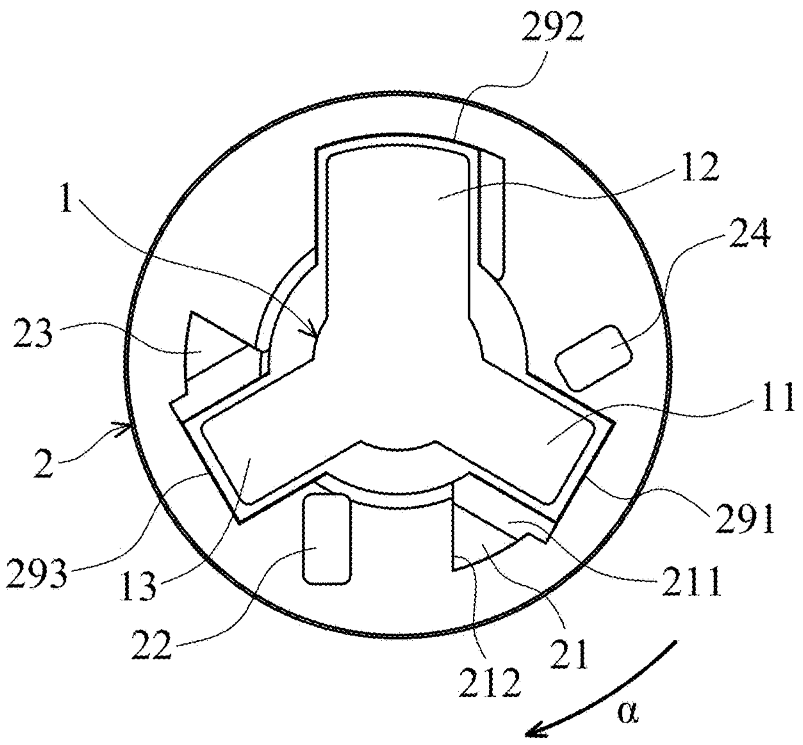
FIG. 5A is a schematic diagram of the cable positioning structure in a first orientation relative to the device housing according to the first embodiment of the present disclosure.
Figure 5B:
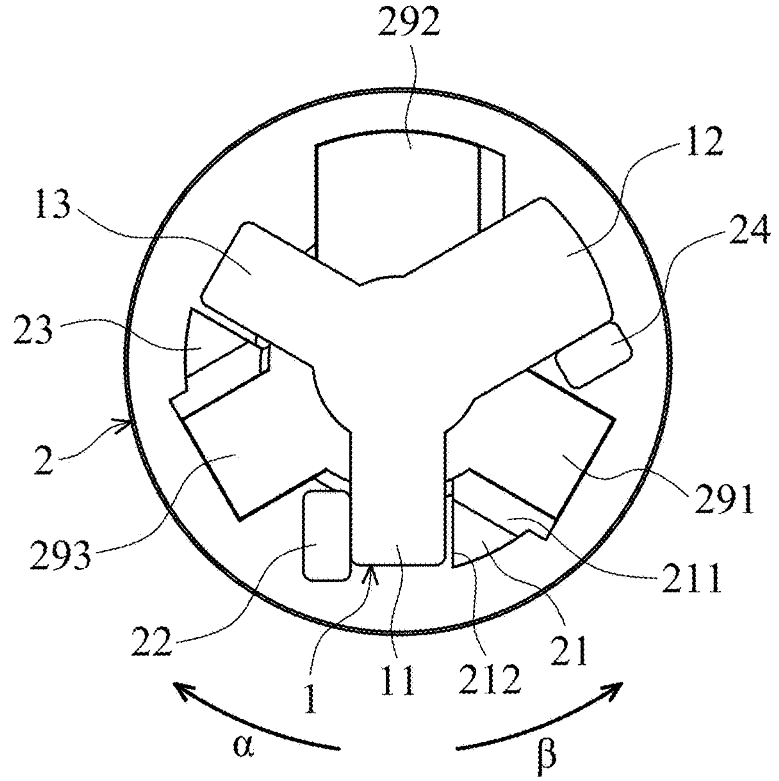
FIG. 5B is a schematic diagram of the cable positioning structure in a second orientation according to the first embodiment of the present disclosure.

FIG. 5A is a schematic diagram of the cable positioning structure in a first orientation relative to the device housing according to the first embodiment of the present disclosure. FIG. 5B is a schematic diagram of the cable positioning structure in a second orientation according to the first embodiment of the present disclosure. Refers to FIGS. 3, 4, 5A, and 5B. The cable positioning structure 1 is adapted to be rotated between a first orientation (FIG. 5A) and a second orientation (FIG. 5B) relative to the device housing H. The housing restriction structure 2 includes a first restrain member 21 and a first stopper 22. In an installed state (FIG. 5A), the cable positioning structure 1 is in the first orientation. The first protrusion 11 is adapted to pass through the first channel region 291. The second protrusion 12 is adapted to pass through the second channel region 292. In a positioned state (FIG. 5B), the cable positioning structure 1 is in the second orientation. The first restrain member 21 and the first stopper 22 restrict the cable positioning structure 1.

Figure 6:
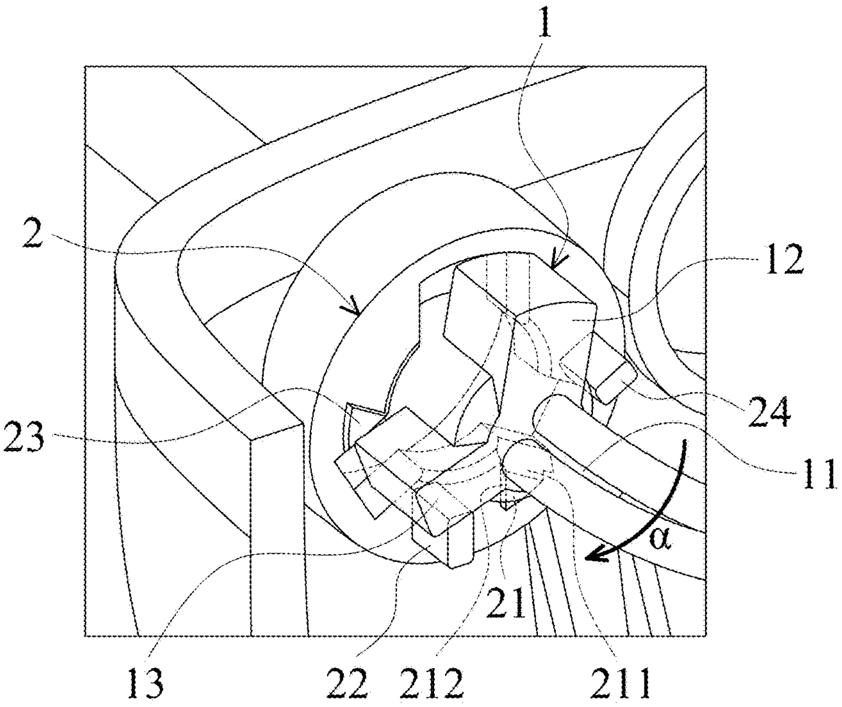
FIG. 6 is a schematic diagram of the rotation of the cable positioning structure relative to the device housing according to the first embodiment of the present disclosure.

FIG. 6 is a schematic diagram of the rotation of the cable positioning structure relative to the device housing according to the first embodiment of the present disclosure. Refers to FIGS. 5A, 5B, and 6. In one embodiment, the first restrain member 21 is adjacent to the first channel region 291. When the cable positioning structure 1 is rotated from the first orientation to the second orientation relative to the device housing H along a first direction α, the first protrusion 11 crosses the first restrain member 21.

Refers to FIGS. 5A, 5B, and 6. In one embodiment, the first restrain member 21 includes a first inclined surface 211. When the cable positioning structure 1 is rotated relative to the device housing H from the first orientation to the second orientation along the first direction α, the first protrusion 11 is guided by the first inclined surface 211 and crosses the first restrain member 21.

Refers to FIGS. 5A, 5B, and 6 together. In one embodiment, the first restrain member 21 includes a first restrain surface 212. When the cable positioning structure 1 is in the second orientation, the first restrain surface 212 is adapted to restrict the first protrusion 11 to prevent the cable positioning structure 1 from rotating from the second orientation to the first orientation along a second direction β relative to the device housing H. The first direction α is opposite to the second direction β.

Refers to FIG. 5B. In one embodiment, when the cable positioning structure 1 is in the second orientation, the first stopper 22 is adapted to restrict the first protrusion 11 to prevent the cable positioning structure 1 from rotating along the first direction α.

Refers to FIGS. 3, 4, and 5A together. In one embodiment, the through hole 29 further includes a third channel region 293. The third channel region 293 is communicated with the central region 295. The cable positioning structure 1 further includes a third protrusion 13. When the cable positioning structure is in the first orientation, the third protrusion 13 is adapted to pass through the third channel region 293.

Refers to FIGS. 3, 4, 5A, and 5B. In one embodiment, the housing restriction structure 2 includes a second stopper 24. When the cable positioning structure 1 is in the second orientation, the second stopper 24 is adapted to restrict the second protrusion 12 to prevent the cable positioning structure 1 from rotating along the first direction α.

Refers to FIGS. 3, 4, 5A, and 5B. In one embodiment, the housing restriction structure 2 includes a second restrain member 23. The second restrain member 23 is adjacent to the third channel region 293. When the cable positioning structure 1 is rotated relative to the device housing H from the first orientation to the second orientation along the first direction α, the third protrusion 13 crosses the second restrain member 23.

Refers to FIG. 3. In one embodiment, the first restrain member 21 and the second stopper 24 are located at two sides of the first channel region 291. The first stopper 22 and the second restrain member 23 are located at two sides of the third channel region 293. In one embodiment, the first restrain member 21 and the first stopper 22 are located between the first channel region 291 and the third channel region 293.

Refers to FIGS. 5A and 5B. In one embodiment, the first protrusion 11, the second protrusion 12, and the third protrusion 13 are extended along the radius direction of the cable C. The above content does not restrict the present disclosure.

Refers to FIGS. 5A and 5B. In one embodiment, the size of the first protrusion 11 is different from the size of the second protrusion 12. The size of the first channel region 291 matches the first protrusion 11. The size of the second channel region 292 matches the size of the second protrusion 12. In other words, the size of the first channel region 291 is different from the size of the second channel region 292.

Figure 7:
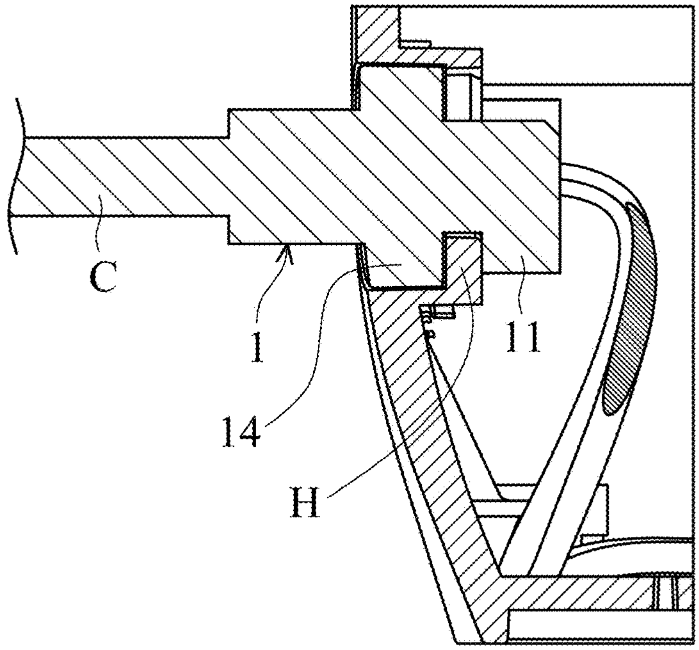
FIG. 7 is a partial cross-sectional view of the electronic device according to the first embodiment of the present disclosure.

FIG. 7 is a partial cross-sectional view of the electronic device according to the first embodiment of the present disclosure. Refers to FIGS. 4 and 7 together. In one embodiment, the cable positioning structure 1 further includes an abutting member 14. In the positioned state, part of the device housing H is clamped between the abutting member 14 and the first protrusion 11. Part of the device housing H is clamped between the abutting member 14 and the second protrusion 12. Part of the device housing H is clamped between the abutting member 14 and the third protrusion 13. In this way, the movement of the cable C on the axis direction can be limited.

In one embodiment, the cable and the cable positioning structure belong to the components of a power cord. However, the above content does not limit the present disclosure. For instance, in another embodiment, the cable can also belong to the components of a signal line.

In one embodiment, the housing restriction structure can be integrally formed on the device housing. However, the above content does not limit the present disclosure. For instance, the housing restriction structure can also be installed on the housing in a buckling or locking manner.

Figure 8:
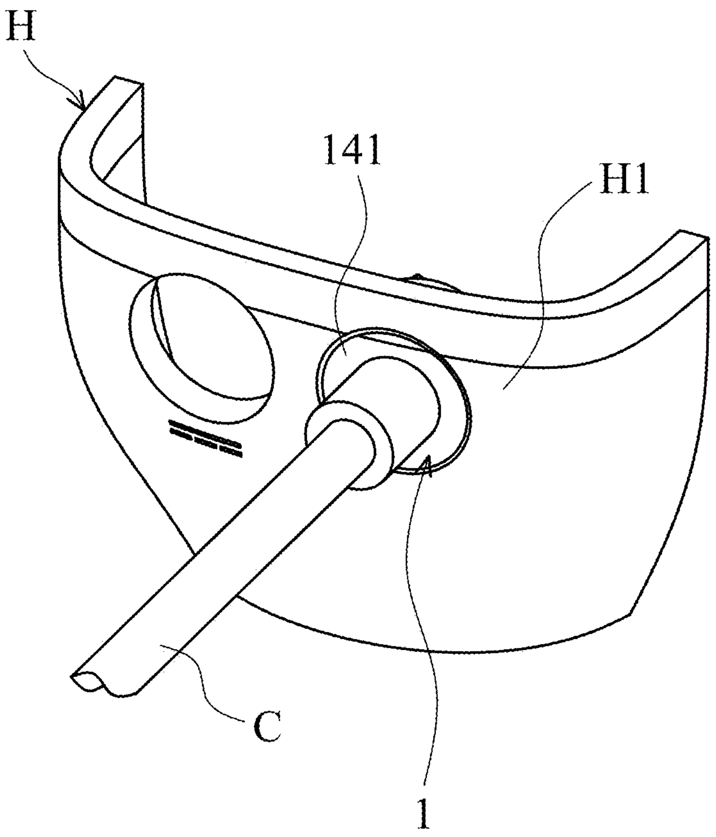
FIG. 8 shows a partial appearance of the electronic device according to the embodiments of the present disclosure.

FIG. 8 shows a partial appearance of the electronic device according to the embodiments of the present disclosure. In one embodiment, the cable positioning structure 1 further comprises an outer curved surface 141. The shape of the outer curved surface 141 can match the appearance of the housing H.

Figure 9A:
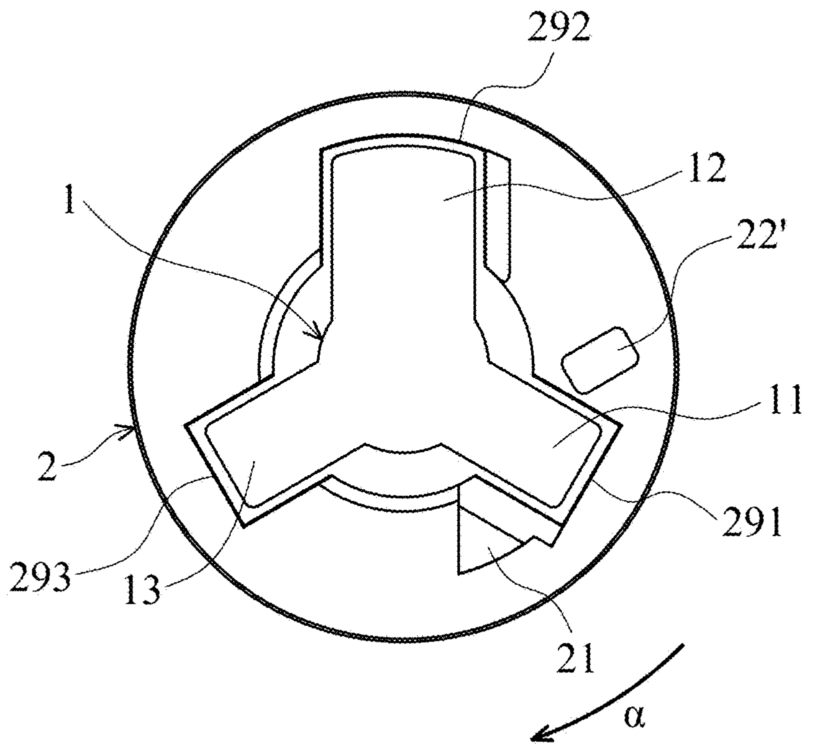
FIG. 9A is a schematic diagram of the cable positioning structure in a first orientation relative to the device housing according to the second embodiment of the present disclosure.
Figure 9B:
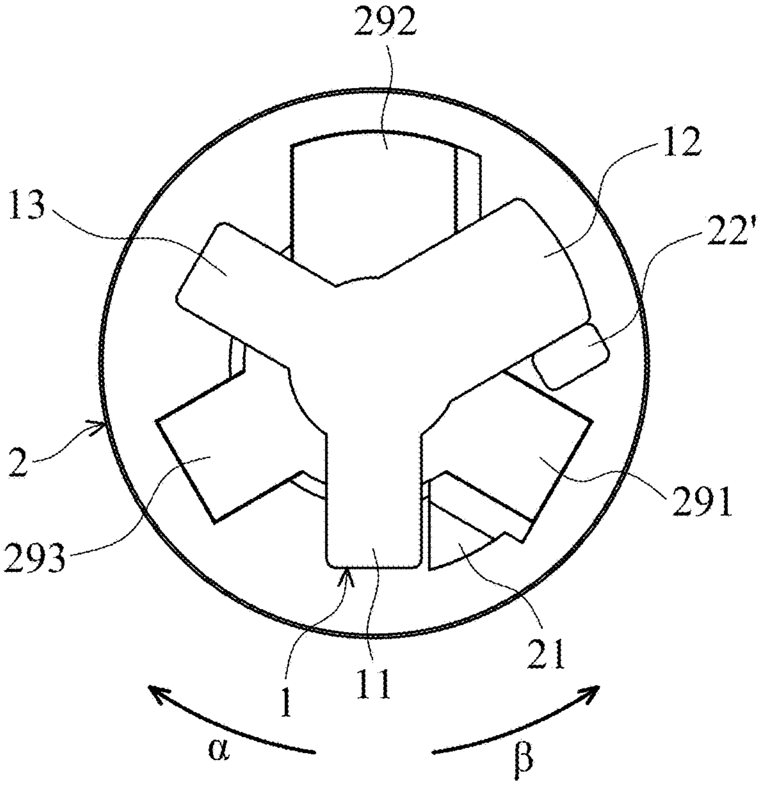
FIG. 9B is a schematic diagram of the cable positioning structure in a second orientation relative to the device housing according to the second embodiment of the present disclosure.

FIG. 9A is a schematic diagram of the cable positioning structure in a first orientation relative to the device housing according to the second embodiment of the present disclosure. FIG. 9B is a schematic diagram of the cable positioning structure in a second orientation relative to the device housing according to the second embodiment of the present disclosure. Refers to FIGS. 9A and 9B. In the embodiment, the first channel region 291 is located between the first restrain member 21 and the first stopper 22'. When the cable positioning structure 1 is in the second orientation, the first stopper 22' is adapted to restrict the second protrusion 12 to prevent the cable positioning structure 1 from rotating along the first direction α. The first restrain member 21 is adapted to restrict the first protrusion 11 to prevent the cable positioning structure 1 from rotating to the first orientation along a second direction β relative to the device housing H.

The electronic device according to the embodiments of the present disclosure incorporates a design that combines a cable positioning structure with a housing restriction structure. The design of the cable positioning structure is relatively simple and can be manufactured in a one-shot injection molding process, resulting in lower production costs. Furthermore, in the positioned state, the first restrain member and the first stopper of the housing restriction structure restrict the cable positioning structure, thereby providing a pre-positioning function to prevent the cable from detaching during the assembly process on the production line.

The foregoing description of the disclosure has been presented only for the purposes of illustration and description option of the exemplary embodiments and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device, comprising:

a device housing comprising a through hole, wherein the through hole comprises a central region, a first channel region, a second channel region and a third channel region, the first channel region is communicated with the central region, the second channel region is communicated with the central region, and the third channel region is communicated with the central region;

a cable passing through the device housing;

a cable positioning structure disposed on the cable, wherein the cable positioning structure comprises a first protrusion, a second protrusion and a third protrusion, the cable positioning structure is adapted to be rotated between a first orientation and a second orientation relative to the device housing; and a housing restriction structure disposed on the device housing, wherein the housing restriction structure comprises a first restrain member, a first stopper, a second restrain member and a second stopper, in an installed state, the cable positioning structure is in the first orientation, the first protrusion is adapted to pass through the first channel region, the second protrusion is adapted to pass through the second channel region, the third protrusion is adapted to pass through the third channel region, and in a positioned state, the cable positioning structure is in the second orientation, the first restrain member and the first stopper restrict the cable positioning structure, wherein the first restrain member is adjacent to the first channel region, the second restrain member is adjacent to the third channel region, when the cable positioning structure is rotated relative to the device housing from the first orientation to the second orientation along a first direction, the first protrusion crosses the first restrain member, and the third protrusion crosses the second restrain member, wherein when the cable positioning structure is in the second orientation, the first stopper is adapted to restrict the first protrusion, the second stopper is adapted to restrict the second protrusion to prevent the cable positioning structure from rotating along the first direction, wherein the first restrain member and the second stopper are located at two sides of the first channel region, the first stopper and the second restrain member are located at two sides of the third channel region, and the housing restriction structure has only two stoppers and two restrain members.

2. The electronic device according to claim 1, wherein the first restrain member comprises a first inclined surface, when the cable positioning structure is rotated relative to the device housing from the first orientation to the second orientation, the first protrusion is guided by the first inclined surface and crosses the first restrain member.

3. The electronic device according to claim 2, wherein the first restrain member comprises a first restrain surface, when the cable positioning structure is in the second orientation, the first restrain surface is adapted to restrict the first protrusion to prevent the cable positioning structure from rotating from the second orientation to the first orientation along a second direction relative to the device housing, and the first direction is opposite to the second direction.

4. The electronic device according to claim 1, wherein the first protrusion, the second protrusion, and the third protrusion are extended along a radius direction of the cable.

5. The electronic device according to claim 1, wherein the size of the first protrusion is different from the size of the second protrusion, the size of the first channel region matches the size of the first protrusion, the size of the second channel region matches the size of the second protrusion.

6. The electronic device according to claim 1, wherein the cable positioning structure further comprises an abutting member, in the positioned state, part of the device housing is clamped between the abutting member and the first protrusion, and part of the device housing is clamped between the abutting member and the second protrusion.

7. An electronic device, comprising:

a device housing comprising a through hole, the through hole comprising a central region, a first channel region, a second channel region, and a third channel region, the first channel region being communicated with the central region, the second channel region being communicated with the central region, and the third channel region being communicated with the central region; and a housing restriction structure disposed on the device housing, wherein the housing restriction structure comprises a first restrain member and a first stopper, the first restrain member comprises a first inclined surface, and the first inclined surface is adjacent to the first channel region, wherein the size of the first channel region is different from the size of the second channel region.

8. The electronic device according to claim 7, wherein the first restrain member and the first stopper are located between the first channel region and the third channel region.

9. The electronic device according to claim 7, wherein the first channel region is located between the first restrain member and the first stopper.

* * * * *